United States Patent
Lee et al.

(10) Patent No.: US 8,241,425 B2
(45) Date of Patent: Aug. 14, 2012

(54) NON-CONDENSING THERMOS CHUCK

(75) Inventors: William D. Lee, Newburyport, MA (US); Ashwin M. Purohit, Gloucester, MA (US); Marvin R. LaFontaine, Kingston, NH (US)

(73) Assignee: Axcelis Technologies, Inc., Beverly, MA (US)

( * ) Notice: Subject to any disclaimer, the term of this patent is extended or adjusted under 35 U.S.C. 154(b) by 732 days.

(21) Appl. No.: 12/358,788

(22) Filed: Jan. 23, 2009

(65) Prior Publication Data

US 2010/0187447 A1 Jul. 29, 2010

(51) Int. Cl.
*C23C 14/50* (2006.01)
*B23B 5/34* (2006.01)
*C23C 14/58* (2006.01)

(52) U.S. Cl. ............. 118/725; 118/728; 118/729; 279/3

(58) Field of Classification Search .................. 118/725, 118/728, 729; 279/3
See application file for complete search history.

(56) References Cited

U.S. PATENT DOCUMENTS

| | | | | | |
|---|---|---|---|---|---|
| 4,261,762 | A | * | 4/1981 | King ............................. | 118/728 |
| 5,103,367 | A | * | 4/1992 | Horwitz et al. ............... | 361/234 |
| 5,958,139 | A | * | 9/1999 | Leibovich et al. ............ | 118/728 |
| 6,686,598 | B1 | | 2/2004 | Walther | |
| 7,019,956 | B2 | | 3/2006 | Fujii et al. | |
| 2008/0121821 | A1 | | 5/2008 | Muka et al. | |
| 2008/0124903 | A1 | | 5/2008 | England et al. | |

* cited by examiner

*Primary Examiner* — Dah-Wei Yuan
*Assistant Examiner* — Stephen Kitt
(74) *Attorney, Agent, or Firm* — Eschweiler & Associates, LLC

(57) ABSTRACT

The present invention is directed to an apparatus and method of forming a thermos layer surrounding a chuck for holding a wafer during ion implantation. The thermos layer is located below a clamping surface, and comprises a vacuum gap and an outer casing encapsulating the vacuum gap. The thermos layer provides a barrier blocking condensation to the outside of the chuck within a process chamber by substantially preventing heat transfer between the chuck when it is cooled and the warmer environment within the process chamber.

11 Claims, 5 Drawing Sheets

NON-CONDENSING THERMOS CHUCK

FIELD

The present invention relates generally to semiconductor processing systems, and more specifically to a method for manufacturing electrostatic chuck for clamping a substrate and transferring thermal energy associated therewith.

BACKGROUND

Processing of silicon wafers is commonplace in the manufacture of modern microelectronics devices. Such processing, including plasma processing and ion implantation may be performed at low pressures, wherein RF or microwave plasmas, or high-power particle beams are delivered to the wafer, therein producing high temperatures at the wafer during processing. Such high temperatures (e.g., temperatures exceeding 100 C for conventional implants, and up to 400 C for other processes), however, can have deleterious effects on the wafer.

For many processes, precise temperature control is not required, as long as the wafer temperature remains at less than a predetermined limit, such as below 100 C in ion implantation or less than 400 C in general. Current trends in ion implantation, however, are tending toward high power serial implanters which generally require cooling with heat transfer coefficients HTC>200 mW/cm$^2$C and temperature control within ±5%. In advanced implant and wafer processing operations, a precise temperature control is typically required, wherein HTC uniformity across a 300 mm wafer, for example, needs to be maintained within 1%. Such processes can have an HTC value, for example, as high as 500 mW/cm$^2$C.

Wafer temperature control and the issues related in semiconductor processing has utilized electrostatic chucks (ESCs) for some time. A typical single-polar ESC is illustrated in FIG. 1, wherein the ESC 10 holds the wafer 20 in place by electrostatic force. The wafer 20 is separated from an electrode 30 by an insulating layer 40. A voltage (e.g., illustrated as a +) is applied to the electrode 30 by a voltage source 50. The voltage applied to the electrode produces an electrostatic field (e.g., illustrated as a "−") at the wafer 20 which induces an equal and opposite charge (e.g., illustrated as a +) on the wafer 20. The electrostatic field on the wafer 20 produces an electrostatic force between the wafer and the ESC 10. Consequently, the electrostatic force holds the wafer 20 against the insulating layer 40.

Cooling of the wafer 20 when utilizing ESCs can be provided by contact conductivity between the wafer and the contact surface 60 of the insulating layer 40, wherein the insulating layer may be cooled by cooling water or a cooling medium. Conventionally, the cooling of the wafer 20 generally increases with the voltage applied to the ESC. Significantly high voltages, however, can have deleterious effects on the wafer (e.g., a cause of particle generation), and may further have costly power supply and consumption considerations, along with increased failure rates. Additionally, the temperature differential created between the warm environment of a processing chamber where the ESC may be located and the internal cooling of the ESC can generate condensation, along with component failure.

In vacuum environments, conventional ESCs utilize a cooling gas between the wafer 20 and the insulating layer 40, wherein a contact surface 60 of the insulating layer 40 comprises a plurality of protuberances (not shown) machined into the insulating layer, therein providing a region for the cooling gas to reside. Typically, a ceramic layer is conventionally machined to form protuberances therein, wherein the protuberances can be formed by bead blasting.

Although low-temperature ion implantation has been attempted, existing approaches suffer from a number of deficiencies. For example, exposure of the vacuum chamber to the low-temperature wafers and/or cooled chucks may result in residual moisture or condensable material (e.g., water) on the outside of the chuck surface while operating at low temperatures, which may cause icing.

In view of the foregoing, it would be desirable to provide a solution for low-temperature ion implantation for use in high-throughput ion implanters which overcomes the above-described inadequacies and shortcomings.

SUMMARY

The following presents a simplified summary in order to provide a basic understanding of some aspects of the disclosure. This summary is not an extensive overview. It is intended to neither identify key or critical elements of the disclosure nor delineate the scope. Its purpose is to present some concepts in a simplified form as a prelude to the more detailed description that is presented later.

The present disclosure is generally directed to a method for forming a clamping plate with a clamping surface for any type of substrate/wafer chuck for heating or cooling a semiconductor substrate while preventing condensate from occurring on the outside of the chuck. The method comprises forming a support mechanism, such as a chuck that can be any mechanical or electrical chuck suitable for holding a semiconductor substrate. The chuck can comprise a support surface or clamping surface to contact the backside of the substrate. The method further comprises forming a thermos layer to encapsulate the support mechanism that is capable of providing a thermal insulating seal around the support mechanism and prevent condensate and icing of components within a process chamber or end station.

In one embodiment, a method of forming a chuck that supports a wafer thereon during ion implantation comprises forming a thermal insulating layer surrounding the chuck. The chuck can comprise a surface for holding a wafer, such as a clamping surface, wherein the thermal insulating layer encapsulates the chuck below the surface supporting the wafer. The thermal insulating layer comprises an outer casing or skin, such as of aluminum, steel, and/or ceramic material. The outer casing or skin can further encapsulate a vacuum gap between the chuck and the casing to significantly deter or prevent condensation on the cooler inner surface. The outer casing and vacuum gap together can form the thermal insulating layer and prevent the formation of condensation from being generated on the outside of the chuck and/or forming within the end station processing chamber during ion implantation.

To the accomplishment of the foregoing and related ends, the disclosure comprises the features hereinafter fully described and particularly pointed out in the claims. The following description and the annexed drawings set forth in detail certain illustrative embodiments. These embodiments are indicative, however, of a few of the various ways in which the principles may be employed. Other objects, advantages and novel features will become apparent from the following detailed description when considered in conjunction with the drawings.

DETAILED DESCRIPTION

Figure 1:
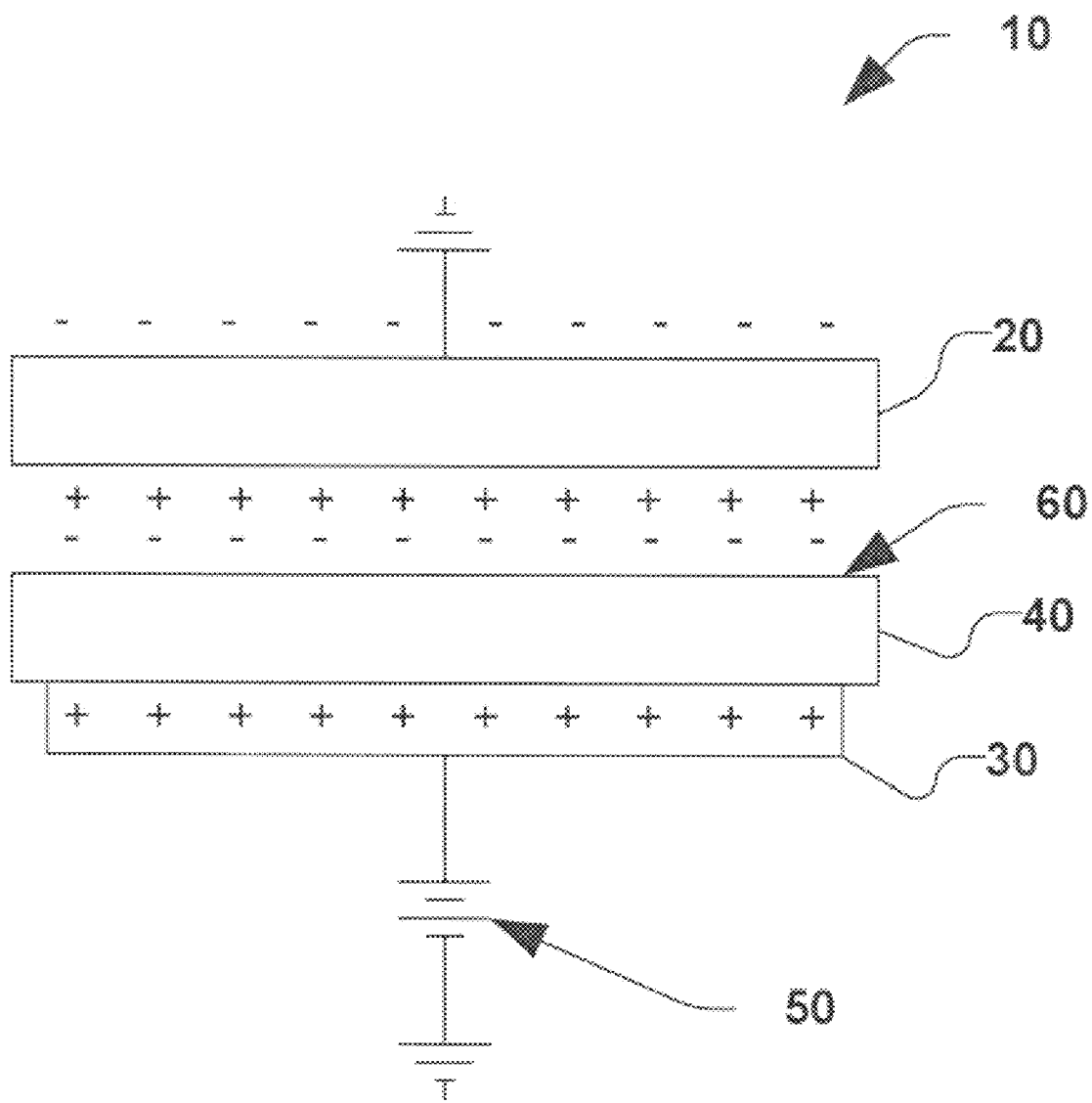
FIG. 1 is a partial cross-sectional view of an exemplary prior art electrostatic chuck.

The present disclosure is directed towards a clamping chuck and an associated method for forming a clamping plate therefore that incorporates several inventive features thereof. In particular, the electrostatic chuck of the present invention increases an ability to uniformly cool a wafer substrate. Accordingly, the present invention will now be described with reference to the drawings, wherein like reference numerals are used to refer to like elements throughout. It should be understood that the description of these aspects are merely illustrative and that they should not be taken in a limiting sense. In the following description, for purposes of explanation, numerous specific details are set forth in order to provide a thorough understanding of the present disclosure. It will be evident to one skilled in the art, however, that the present disclosure may be practiced without these specific details.

The present disclosure overcomes challenges of the prior art via a thermal insulating layer surrounding a substrate chuck or wafer support assembly to prohibit heat transfer to outer surfaces of a chuck. The thermal insulating layer can mitigate concerns with condensation forming on the outside of the chuck when running cold implants. For example, a support assembly can be cooled through a cooling system to a temperature of about 10 degrees Celsius or colder. The wafer support assembly can reside within an end station or processing chamber that can have a much warmer temperature in comparison to the temperature of the wafer support assembly. Consequently, such temperature differentials can cause condensation to form on the outside of the chuck and thereby result in icing, and thus, system failures resulting thereof. The structure and techniques disclosed herein are applicable to any type of substrate/wafer support assembly for ion implantation, such as electrostatic chucks, for example, and/or mechanical chucks.

Figure 2:
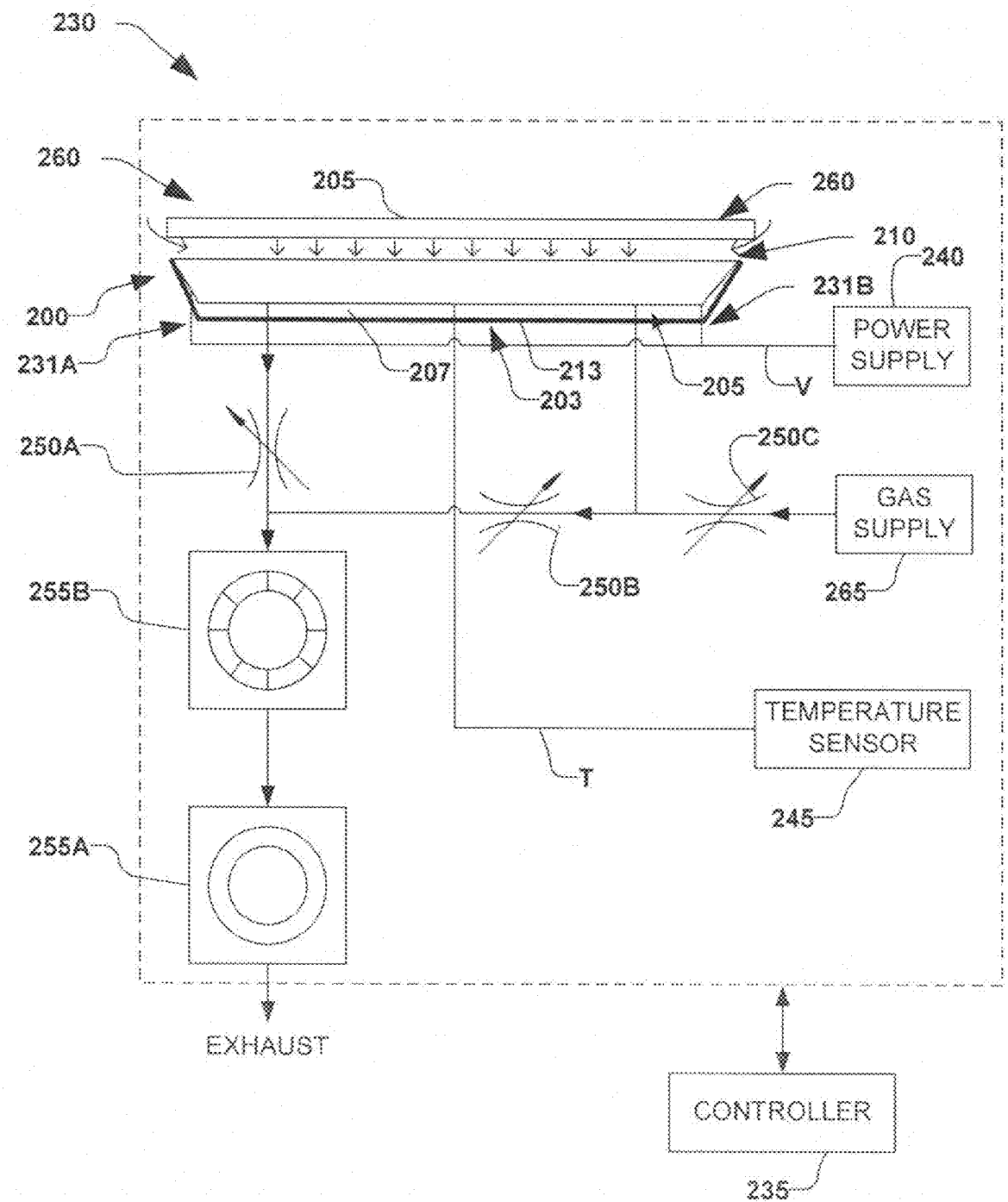
FIG. 2 illustrates a system-level block diagram of an exemplary electrostatic chuck according to an aspect of the present disclosure.

FIG. 2 is a block diagram of a system 230 comprising an electrostatic chuck 200 illustrated according to several aspects of the disclosure. Although an electrostatic chuck is illustrated herein, the aspects disclosed herein can apply to any substrate chuck or support assembly for implanting ions to a semiconductor substrate, and thus, the disclosure is not restricted to any particular type of chuck assembly. For example, mechanical chucks, platen assemblies, and/or electrical chucks for clamping a wafer can also be comprised.

According to one exemplary aspect of the present disclosure, the system 230 for controlling the electrostatic chuck 200 can comprise a controller 235 operatively coupled to a voltage power supply 240. The controller 235 can be operable to control the voltage V supplied to the poles 231A, 231B of the ESC 200 by controlling the voltage supply 240, wherein the voltage is proportional to an amount of clamping force seen by the substrate 205 due to electrostatic forces induced by the voltage. According to one example, the controller 235 can further control an amount of contact heat transfer coefficient (HTC) of the ESC 200 by increasing or decreasing the voltage V, whereby the electrostatic force, and hence the clamping force, is respectively increased or decreased. According to the above example, controlling the voltage V applied to the electrostatic chuck 200 of FIG. 2 advantageously controls the amount of thermal conduction through a clamping plate 210. At the low contact pressure, the substrate 205 is still clamped or secured, but a minimal amount of thermal energy is transferred between the substrate 205 and the electrostatic chuck 200, wherein a thermal portion of the chuck is substantially "off". When a larger voltage V (e.g., approximately 600 volts) is applied to the ESC 200, the contact pressure between the substrate 205 and the clamping plate 210 can be substantially increased, thereby quickly increasing the HTC between the substrate 205 and the clamping plate 210, and thus effectively turning the thermal portion of the chuck "on" for heating or cooling the substrate.

The controller 235, in this example, can be operable to control the contact pressure by quickly controlling the voltage V applied to the ESC 200, thereby allowing the ESC to quickly change states (e.g., from a heating condition to a cooling condition). The controller 235, for example, can be further operable to feed back wafer temperature data T from a temperature sensor 245 associated with the ESC, wherein the voltage supply 240 can be controlled in a closed-loop feedback arrangement. Alternatively, the controller 235 is operable to generally limit the HTC between the substrate 205 and the ESC 200 when a predetermined temperature is reached.

According to another exemplary aspect, the system 230 of FIG. 2 further can comprise one or more valves 250A-250C, wherein the one or more valves are operable to selectively permit one or more vacuum pumps 255 to pump the cooling gas 260 through the electrostatic chuck 200 in various modes for gas thermal conductance between the substrate 205 and the ESC. The one or more valves 250A-250C, for example, can comprise one or more automatic valves (e.g., valve 250A) such as fast-acting solenoid valves or poppet valves, or any suitable valve as one of ordinary skill in the art can appreciate.

According to another exemplary aspect, the controller 235 can be operatively coupled to the one or more vacuum pumps 255A-255B, a gas supply 265, the voltage supply 240, and the one or more valves 250A-250C. Controlling the vacuum applied to the electrostatic chuck 200 in the present example advantageously controls an amount of thermal conduction through the cooling gas. Therefore the valve 250A that can control the backside pressure allows the electrostatic chuck 100 to quickly change states (e.g., from a heating condition to a cooling condition). The controller 235, therefore, is further operable to control a gas pressure between the substrate 205 and the electrostatic chuck 200 via controlling the one or more automatic valves 250. The electrostatic chuck 200 can comprise any suitable cooling mechanism as one of ordinary skill in the art can appreciate. For example, liquid coolant could flow through a coolant loop (not shown) that may carry excess heat away from the backside of the wafer 105.

As an example of use in an ion implanter (not shown), an arsenic (As) implant at a beam energy of 60 keV and a beam current of 20 mA can deposit approximately 1200 W of energy into the end-station (not shown) comprising the electrostatic chuck 200 and wafer 205. During this ion implantation process, a temperature difference between the wafer 205 and electrostatic chuck 200 may be about 40° C. For example, a flow of water, cooled by an external water-cooled heat exchanger (not shown) to 20° C., may be circulated to the chuck 200 at a rate of 0.6 gpm (gallons per minute), through pipes, tubes or channels of some sort. This flow of water may be sufficient to ensure that the wafer temperature does not exceed an upper limit (e.g., 100° C., above which photoresists that mask the wafer are known to degrade). In some cases the chuck is cooled to low temperatures (e.g., <20° C.). Under these circumstances material can condense on the chuck leading to a host of problems.

In one embodiment, the electrostatic chuck 200 further comprises a thermal insulating layer 203 that prevents condensation forming on the outside of the chuck 200. The thermal insulating layer 203 encapsulates the electrostatic chuck to prohibit heat transfer to the outer surfaces of the chuck. The chuck, therefore, can comprise a thermos skin or outer casing 213 that creates a thermos condensation barrier 205 surrounding the electrostatic chuck 200 in order to allow drastically different temperatures to exist on either side of the barrier 205.

In one embodiment, the thermos insulating layer 203 comprises an outer skin and/or casing and a vacuum gap 207 formed therein. The vacuum gap can surround the outside of the chuck 200 below the clamping plate 210. The vacuum gap 207 can comprise a first vacuum that is generated from an outside second vacuum within an area separated by the outer casing 213. This outer casing can comprise an orifice (not shown) therein allowing the first vacuum within the vacuum gap to be generated by the second vacuum outside, but is small enough to prevent significant condensate from passing there through.

Figure 3:
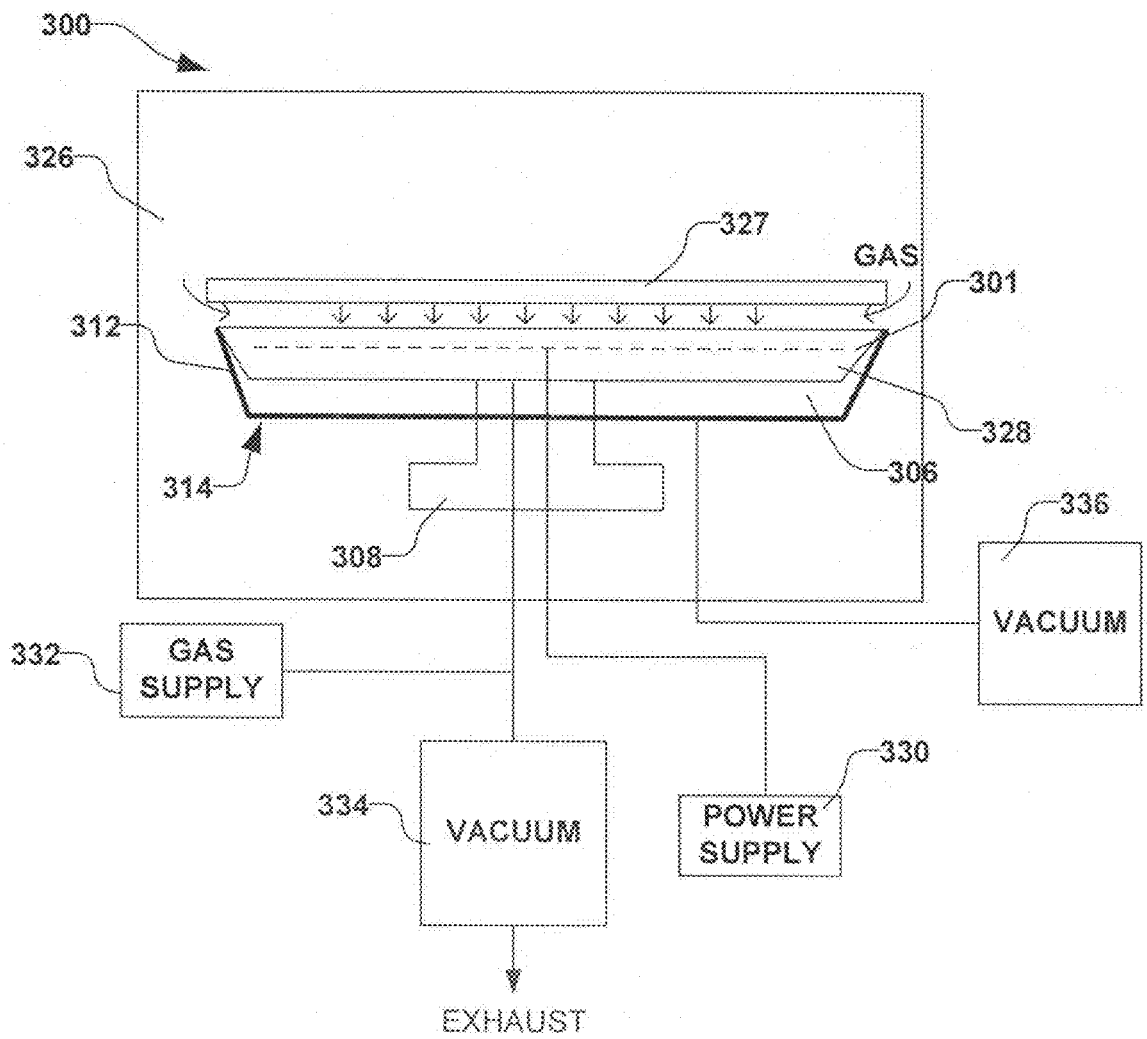
FIG. 3 illustrates a partial cross-sectional view of a wafer support assembly that can be modified for low-temperature ion implantation in accordance with one aspect of the present disclosure.

FIG. 3 illustrates a wafer support assembly 300 as an example of one embodiment for supporting a wafer during ion implantation. The wafer support assembly 300 may be implemented in and through an end-station or vacuum chamber 326. The wafer support assembly 300 may comprise a wafer support chuck 328, as well as other mounting mechanisms, such as a mount support block 308, which can be coupled together via one or more bearings and/or joints (not shown). A wafer 327 may be held onto the wafer support chuck 328 by a clamping force to receive ion implantation from an ion beam (not shown). The wafer 327 can be electrostatically clamped, mechanically clamped or clamped by any other mechanism in which one of ordinary skill in the art can appreciate.

The wafer support chuck 328 or platen can comprise an electrode member 301 embedded within a ceramic material for generating a clamping force. For example, a power supply 330 can be provided for generating an electrostatic force through electrode member 301 for clamping the backside of wafer 327 to the surface of chuck 328. Additionally, a cooling system (not shown) may be incorporated into or coupled with the wafer support assembly 300 and can comprise any cooling system for cooling a wafer support chuck 328 appreciated by one of ordinary skill in the art. The wafer 327 may transfer heat through a backside gas generated by a gas supply 332 into the wafer support chuck 328, and coolant (e.g., a liquid coolant) flowing through may then carry the excess heat away. In one embodiment, the chuck 328 can be cooled as low as 10 Celsius to negative 80 Celsius, or any temperature cool enough to result in condensation forming from within the chuck.

In one embodiment, a thermos insulating layer 314 encapsulates the wafer support chuck 328 at its backside below the surface of the chuck where the backside of the wafer 327 faces. In the illustration of FIG. 2 this would mean to the left of the surface, although encapsulating the backside of the chuck 328 can mean anywhere except the surface of contact. Further, the thermos insulating layer 314 comprises a vacuum gap 306 with a first vacuum therein, and an outer skin 312 or outer casing that comprises a sealed barrier around the vacuum gap 306. The outer skin 312 can comprise aluminum, steel and/or ceramic encasing.

In one embodiment the high vacuum within the end station 326 can be a second vacuum that generates a first vacuum within a thermos insulating layer 314, such as within the vacuum gap 306. The outer skin 312 can comprise a small opening (not shown) for allowing the vacuum within the end station 326 to generate the first vacuum within the vacuum gap 306. The second vacuum within the end station 326 can provide a background pressure within the chamber therein that is about $10^{-3}$-$10^{-7}$ Torr, for example, about $10^{-5}$ Torr. In another embodiment, the first vacuum in the vacuum gap 306 can be generated by a separate vacuum pump 336 instead of from the second vacuum in the end station 326 or other processing chamber generated from vacuum pump 332.

The thermos insulating layer 314 insulates the chuck 328 where it is cooled and keeps the components therein hotter or cooler than their environment outside without the need to modify the pressure, by interposing an evacuated region to provide thermal insulation between the contents and the environment (e.g., the end station environment). The first vacuum referred to is used for thermal insulation; the contents are not necessarily in vacuum conditions. Using vacuum as an insulator avoids heat transfer by conduction or convection. Additionally, radiative heat loss can be minimized by applying a reflective coating to surfaces, similar to a Dewar thermos, which uses silver as one option.

Every time a wafer is brought into or out of the end station or vacuum chamber there can be a small burst of air that comes in. Consequently, all sorts of products from the photoresist and other outside gassing materials can also come from the wafer itself. The pressure in the vacuum is low, but there are plenty of condensable materials that can condense on the chuck, especially when run at a cold temperature. Therefore, the thermos insulating layer can protect the chuck from such condensation.

Figure 4:
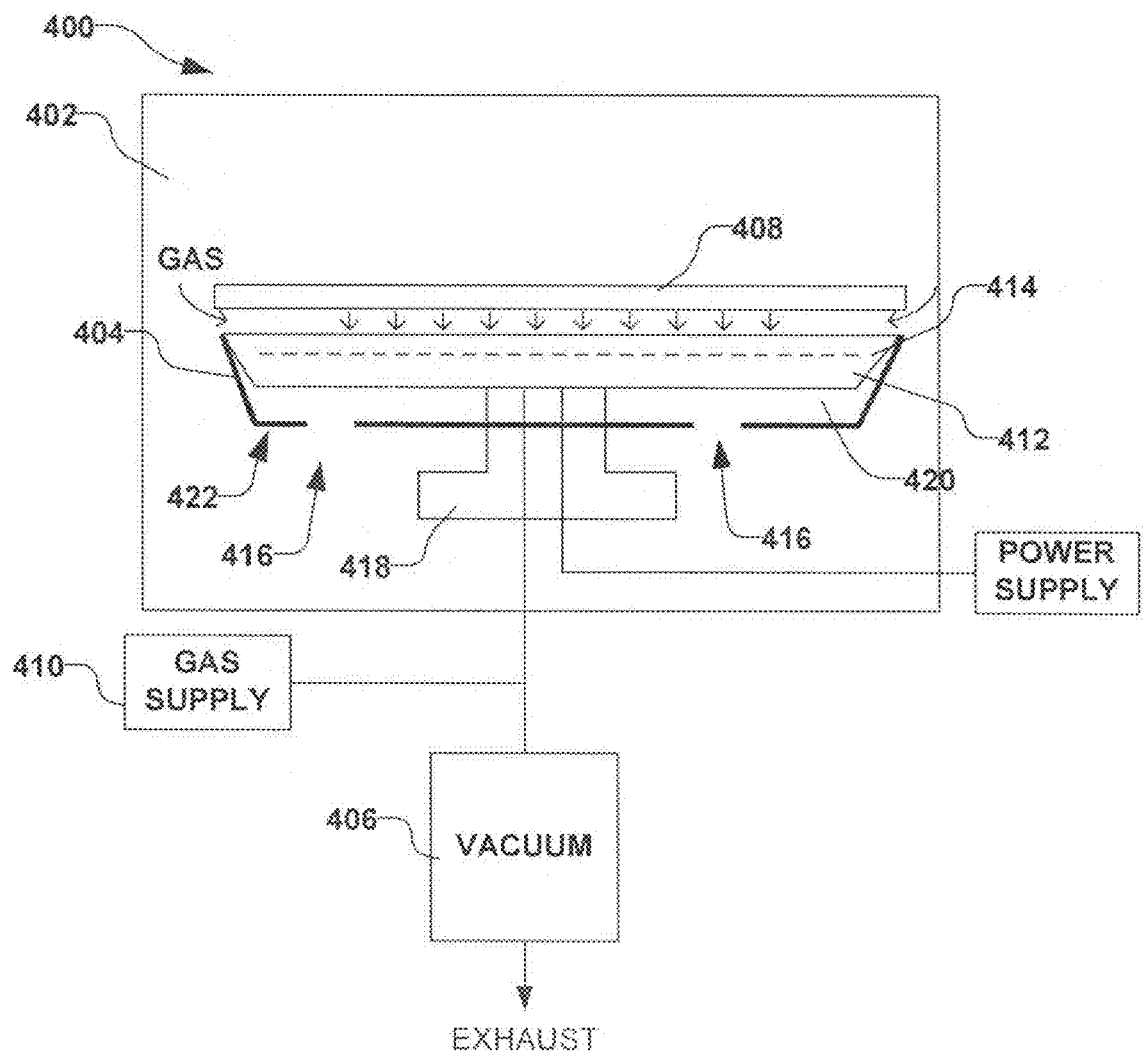
FIG. 4 illustrates a partial cross-sectional view of a wafer support assembly that can be modified for low-temperature ion implantation in accordance with one aspect of the present disclosure.

FIG. 4 illustrates an end station 400 that may enclose a vacuum space 402, such as a vacuum chamber or process chamber for implanting ions into a wafer 408. The wafer 408 can be set into a fixed position by a wafer holder 412 with an electrode 414 and a cooling unit (not shown) therein coupled to the wafer holder 412. The wafer holder 412 is typically a fixed platen that may be supported by a mounting base 418 capable of motion or stationary and may secure the wafer 408 in place with, for example, an electrostatic force. Alternatively, the wafer holder may be a mechanical system also.

One or more vacuum pumps 406 can be coupled to the wafer holder 412 to pump the cooling gas through the holder in various modes for gas thermal conductance between the wafer 408 and the wafer holder 412. A vacuum may be applied to the end station 400 in the present example advantageously controlling an amount of thermal conduction through the cooling gas. Therefore the pressure can allows the wafer holder 412 to quickly change states (e.g., from a heating condition to a cooling condition). In addition, the vacuum pump 406 may be used to control a gas pressure through a gas pump 410 supplying gas pressure between the wafer 408 and the wafer holder 412. The wafer holder 412 can comprise any suitable cooling mechanism as one of ordinary skill in the art can appreciate. For example, liquid coolant could flow through a coolant loop (not shown) that may carry excess heat away from the backside of the wafer 408.

In one embodiment, the wafer holder 412 comprises a thermos insulating layer 422 encapsulating the backside of the wafer holder 412, such as the surface where the wafer 408 is not being supported. The thermos insulating layer 422 can comprise an outer skin or casing 404 that thermally isolates the backside of the wafer holder 412 from the end station 400. The outer skin 408 can further encapsulates a vacuum gap 420 that contains an evacuated space. In one embodiment, the outer skin 408 can comprise aluminum, steel and/or ceramic encasing. The vacuum gap 420 can be a vacuumed space that thermally insulates the wafer holder 412 from the rest of the end station 400 and prevents condensation from forming thereon.

In one embodiment, the outer skin 404 comprises one or more small openings or orifi 416 that enables the vacuum gap 420 to have a vacuumed pressure therein originating from the vacuum 402 within the end station 400.

In one embodiment the high vacuum within the end station 400 can be a second vacuum 402 that generates a first vacuum within a thermos insulating layer 422, such as within the vacuum gap 420. The outer skin 408 can comprise a small opening 416 for allowing the vacuum within the end station 400 to generate the first vacuum within the vacuum gap 420. The second vacuum within the end station 400 can provide a background pressure within the chamber therein that is about $10^{-3}$-$10^{-7}$ Torr, for example, about $10^{-5}$ Torr. In another embodiment, the first vacuum in the vacuum gap 420 can be generated by a separate vacuum pump (not shown) instead of from the second vacuum 402 in the end station 400 or processing chamber.

Figure 5:
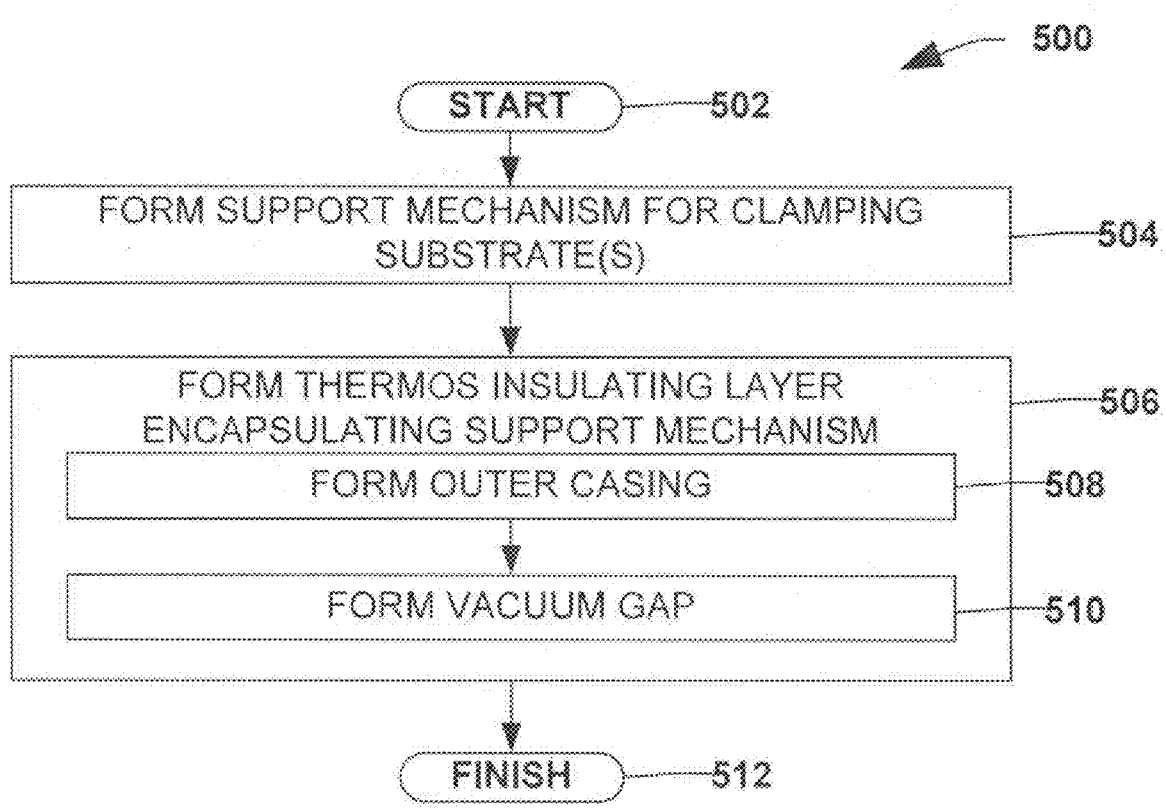
FIG. 5 is a flow chart diagram illustrating an exemplary methodology for forming a semiconductor-based electrostatic chuck according to the present invention.

Referring now to FIG. 5, an exemplary method 500 is illustrated and described hereinafter for fabricating a wafer support, such as a substrate wafer chuck/platen. Although the method 500 and other methods herein are illustrated and described below as a series of acts or events, it will be appreciated that the present disclosure is not limited by the illustrated ordering of such acts or events. For example, some acts may occur in different orders and/or concurrently with other acts or events apart from those illustrated and/or described herein, in accordance with the invention. In addition, not all illustrated steps may be required to implement a methodology in accordance with the present invention. Furthermore, the methods according to the present invention may be implemented in association with the formation and/or processing of structures illustrated and described herein as well as in association with other structures not illustrated.

The method 500 initializes at 502, and at 504 a support mechanism for clamping a substrate is formed. The support mechanism can be any support mechanism for holding a substrate or substrates for ion implantation processes. For example, the support mechanism can comprise an electrostatic chuck or mechanical platen, which is cooled therein by any type of cooling mechanism. At 506 a thermos insulating layer is formed to encapsulate the support mechanism on surfaces outside of a surface contacting the substrate, such as the substrate's backside. In one embodiment, the thermos insulating layer can be formed below a clamping surface. The thermos insulating layer can be formed by first forming an outer casing or outer skin at 508. The outer casing can encapsulate a vacuum gap that is formed at 510 between the outer casing and the support mechanism. The outer casing can comprise an orifice opening for allowing a vacuum to be within the vacuum gap that originates from another vacuum within a chamber housing the support mechanism. At 512 the method finishes.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application.

What is claimed is:

1. A substrate chuck within a vacuum chamber of an ion implantation system for supporting a substrate and controlling a heat transfer associated therewith, the substrate chuck comprising:
   a support mechanism comprising a clamping surface to hold a substrate during ion implantation and to facilitate movement of the wafer in at least one dimension;
   a cooling mechanism coupled to the support mechanism;
   a thermos layer substantially surrounding the substrate chuck outside of the clamping surface, the thermos layer comprising:
      a vacuum gap surrounding the outside of the support mechanism; and
      an outer casing that substantially encapsulates the vacuum gap;
   wherein the thermos layer creates a vacuum barrier between the support mechanism and outside of the support mechanism thereby preventing condensation on and heat transfer to the walls of the support mechanism,
   wherein the outer casing of the thermos layer further comprises an orifice, and the vacuum gap comprises a first vacuum generated by a second vacuum within the vacuum chamber via fluid connection therebetween via the orifice.

2. The substrate chuck of claim 1, wherein the support mechanism comprises a nearly constant temperature within the thermos layer after cooling by the cooling mechanism sufficient to prevent condensation formation on an outside surface of the support mechanism.

3. The substrate chuck of claim 1, wherein the cooling mechanism coupled to the support mechanism comprises cooling structures within the support mechanism for cooling the support mechanism to a temperature below the temperature of the substrate.

4. The substrate chuck of claim 1, wherein the outer casing comprises an aluminum encasing, steel encasing or ceramic encasing.

5. The substrate chuck of claim 1, wherein the support mechanism cools to a temperature of 10 Celsius to negative 80 Celsius.

6. The substrate chuck of claim 1, wherein the substrate chuck further comprises an electrostatic chuck encapsulated by the thermos layer.

7. The substrate chuck of claim 1, wherein the outer casing comprises a valve associated with the orifice for controlling an opening from the vacuum gap to an environment within the outside chamber.

8. The substrate chuck of claim 1, wherein the thermos layer substantially reduces heat transfer from the support mechanism to an outside surface of the support mechanism sufficient to block condensation forming thereon, and comprises a thickness of between 0.1 mm to 10 mm.

9. The substrate chuck of claim 1, wherein the outer casing substantially separates the support mechanism from at least one portion of the cooling mechanism and a vacuum space within the vacuum chamber in which the wafer is held during ion implantation.

10. A wafer support chuck of an ion implantation system for supporting a wafer above a surface and controlling a heat transfer associated therewith, the wafer support chuck comprising:
- a thermos layer substantially surrounding the wafer support chuck below the surface, the thermos layer comprising:
  - a vacuum gap surrounding the outside of the wafer support chuck below the surface; and
  - an outer casing that substantially encapsulates the vacuum gap,
- wherein the thermos layer comprises a thermos condensation barrier between the wafer support chuck and a process chamber thereby preventing condensation outside of the wafer support chuck and to the process chamber, and further comprises an orifice opening located on a backside of the thermos layer surrounding the wafer support chuck, and
- wherein the vacuum gap comprises a first vacuum in a first vacuum area and a process chamber comprises the wafer support chuck and a second vacuum in a second vacuum area, and the second vacuum comprises a pressure to generate the first vacuum through an orifice within the thermos layer.

11. The substrate chuck of claim 10, wherein the thermos layer substantially reduces heat transfer from the wafer support chuck to the process chamber sufficient to block condensation forming therein, and comprises a thickness of between 0.1 mm to 10 mm.

* * * * *